(12) United States Patent
Ratautas et al.

(10) Patent No.: US 10,982,328 B2
(45) Date of Patent: Apr. 20, 2021

(54) METHOD FOR FORMATION OF ELECTRO-CONDUCTIVE TRACES ON POLYMERIC ARTICLE SURFACE

(71) Applicant: VALSTYBINIS MOKSLINIU TYRIMU INSTITUTAS FIZINIU IR TECHNOLOGIJOS MOKSLU CENTRAS, Vilnius (LT)

(72) Inventors: Karolis Ratautas, Vilnius (LT); Gediminas Raciukaitis, Vilnius (LT); Aldona Jagminiene, Vilnius (LT); Ina Stankeviciene, Vilnius (LT); Eugenijus Norkus, Vilnius (LT)

(73) Assignee: VALSTYBINIS MOKSLINIU TYRIMU INSTITUTAS FIZINIU IR TECHNOLOGIJOS MOKSLU CENTRAS, Vilnius (LT)

( * ) Notice: Subject to any disclaimer, the term of this patent is extended or adjusted under 35 U.S.C. 154(b) by 0 days.

(21) Appl. No.: 16/332,272

(22) PCT Filed: Sep. 6, 2017

(86) PCT No.: PCT/IB2017/055362
§ 371 (c)(1),
(2) Date: Mar. 11, 2019

(87) PCT Pub. No.: WO2018/051210
PCT Pub. Date: Mar. 22, 2018

(65) Prior Publication Data
US 2019/0360104 A1 Nov. 28, 2019

(30) Foreign Application Priority Data
Sep. 13, 2016 (LT) .................................. 2016 514

(51) Int. Cl.
*C23C 18/16* (2006.01)
*C23C 18/20* (2006.01)
(Continued)

(52) U.S. Cl.
CPC ...... *C23C 18/1612* (2013.01); *C23C 18/1608* (2013.01); *C23C 18/204* (2013.01);
(Continued)

(58) Field of Classification Search
CPC ............ C23C 18/1612; C23C 18/1608; C23C 18/204; C23C 18/285; C23C 18/30;
(Continued)

(56) References Cited

U.S. PATENT DOCUMENTS 4,042,730 A * 8/1977 Cohen .................... C23C 18/28
                                                    205/126
4,089,993 A * 5/1978 Shirahata ............... H05K 3/387
                                                    427/129
(Continued)

FOREIGN PATENT DOCUMENTS

EP   0272420 A2   6/1988
EP   1975276 A1   10/2008
(Continued)

OTHER PUBLICATIONS

International Search Report for PCT/IB2017/055362 dated Oct. 27, 2017.

*Primary Examiner* — Michael P Wieczorek
(74) *Attorney, Agent, or Firm* — Brown & Michaels, PC

(57) ABSTRACT

The present invention relates to a production of electro-conductive traces on the surface of polymeric articles using laser excitation for the areas to be metallised, followed by activation of the laser-treated areas with a metal salt solution, the article is later rinsed in distilled water, and the activated areas are metallised in the chemical plating bath.
(Continued)

The aims of the invention are to produce cost-effective conductive traces of the circuits for the application in 3D moulded interconnect devices, to increase the quality of the circuit traces improving the selective metallization process. An irradiation dose and scanning parameters for the surface excitation are chosen experimentally, provided that a negative static charge appears on the surface of the laser-irradiated areas. The chosen parameters ensure that any surface degradation of the polymer is avoided. The activation solution used in the method is aqueous solution consisting of one chosen salt comprising: silver (Ag), copper (Cu), nickel (Ni), cobalt (Co), zinc (Zn), chrome (Cr), tin (Sn) salt.

11 Claims, 1 Drawing Sheet

(51) Int. Cl.
    *C23C 18/28*     (2006.01)
    *C23C 18/30*     (2006.01)
    *C23C 18/40*     (2006.01)
    *C23C 18/44*     (2006.01)
    *H05K 3/18*     (2006.01)

(52) U.S. Cl.
    CPC ............ *C23C 18/285* (2013.01); *C23C 18/30* (2013.01); *C23C 18/405* (2013.01); *C23C 18/44* (2013.01); *H05K 3/187* (2013.01); *H05K 2203/107* (2013.01)

(58) Field of Classification Search
    CPC ....... C23C 18/405; C23C 18/44; C23C 18/28; C23C 18/52; C23C 18/40
    See application file for complete search history.

(56) References Cited

U.S. PATENT DOCUMENTS

| | | | | |
|---|---|---|---|---|
| 4,440,801 | A * | 4/1984 | Aviram | ............... C23C 18/1612 427/306 |
| 6,645,557 | B2 * | 11/2003 | Joshi | ....................... C23C 18/22 427/304 |
| 6,806,189 | B2 * | 10/2004 | Kim | ...................... H01L 21/288 257/E21.174 |
| 7,473,307 | B2 * | 1/2009 | Song | ....................... C09D 1/00 106/1.23 |
| 2003/0031803 | A1 | 2/2003 | Belouet et al. | |
| 2004/0026254 | A1 | 2/2004 | Hupe et al. | |
| 2005/0218110 | A1 | 10/2005 | Furihata et al. | |
| 2005/0266352 | A1 | 12/2005 | Kano et al. | |
| 2006/0045974 | A1 * | 3/2006 | Campbell | ........... C23C 14/0623 427/304 |
| 2015/0279731 | A1 * | 10/2015 | Li | .......................... H05K 3/107 257/753 |
| 2015/0322574 | A1 | 11/2015 | Yee et al. | |

FOREIGN PATENT DOCUMENTS

| | | |
|---|---|---|
| EP | 2311048 A1 | 4/2011 |
| WO | 2002023962 A2 | 3/2002 |

* cited by examiner

METHOD FOR FORMATION OF ELECTRO-CONDUCTIVE TRACES ON POLYMERIC ARTICLE SURFACE

TECHNICAL FIELD

The invention relates to the production of electro-conductive traces on the surface of polymeric articles using laser excitation for the areas to be metallised, followed by activation of the laser-treated areas with a metal salt solution, followed by metallization of the activated areas in the chemical plating bath. The invention intended for the formation of electro-conductive traces in 3D moulded interconnect devices.

RELEVANT PRIOR ART

WO2002023962 (2000 Sep. 18) describes a selective metallization process of polymers which are susceptible for carbonisation after an increase of their surface temperature above a critical value for thermal decomposition. The method comprises activation of the selected areas by laser irradiation so that mentioned areas are carbonised. The laser-treated areas become electro-conductive. The article can be selectively metallised later by submerging it into a chemical plating bath or using a galvanic metallization process.

The disadvantage of the known method is that formation of conductive areas can be applied only for polymers, which are susceptible for carbonisation, such as phenyl formaldehyde resins, polyimides, polymers of furfuryl alcohol. Moreover, the surface after carbonisation is brittle and the metal layer is only weakly adherent after the metallization step.

US2015/322574 (2015 Nov. 12) describes a pretreatment process for selective electroless metallization of surfaces of a non-conductive material, and a chemical solution applicable for the pretreatment is provided.

The disadvantage of the known method is that the process works only on the areas already containing catalysts. The LDS (LPKF method Laser Direct Structuring) material (having special additives dispersed in a polymer for catalysts formation after laser treatment) is used as an example. The LDS material is very expensive comparing with standard polymers. The patent US2015/322574 indicates that: "The non-conductive material optionally contains one or more metal or metal compounds. Metal compounds include metal oxides, metal silicates, metal phosphates and metal chelates". The pretreatment method is used after the LDS material is irradiated with Nd:YAG nanosecond laser. Moreover, all examples given in the patent uses the LDS material.

According to example 1; table 1 this method discloses selective patterning on a polymer for PCB, which comprises taking a PC/ABS polymer, selective irradiating with a laser, dipping in a catalyst solution and electroless plating with copper, however, copper has not been deposited on irradiated areas using mentioned polymeric material without the LDS additives.

US2004026254 (2004 Jan. 12) describes a selective metallization of a dielectric material, wherein said the dielectric material is coated with an active layer containing electro-conductive material. The active layer is ablated by a laser in order to form electro-conductive areas from the remaining layer followed by the metallization step. Ceramic or polymers can be used as a dielectric material. The deposited active layer is an electro-conductive polymer comprising copolymerized pyrrole, furan, thiophene and/or their derivatives, poly-3,4-ethylene-dioxythiophene. The activating layer can also consist of metal sulphides and/or metal polysulphides. Metallization is performed by the galvanic metallization process.

The disadvantage of the known method is that the method contains additional technological steps concerning the deposition of the activation layer. Moreover, its deposition on the curved surfaces is very challenging. Therefore, processing of 3D surfaces becomes complicated.

EP 2311048 (2009 Aug. 7) describes a method for increasing the electrical conductivity of the surface of a shaped polymer body, comprising the following steps: a) providing a shaped polymer body of at least one polymer phase that contains carbon nanotubes (CNT); b) thermal treatment of the surface of the shaped polymer body for increasing the electrical conductivity of the treated surface, wherein the thermal treatment comprises heating to the temperature which is equal to or higher than the melting temperature of the at least one polymer phase; c) metallization of the formed conductive areas using galvanic metallization process.

The known method has several disadvantages. The method can be applied to the polymer materials only with the addition of CNT into a blend. However, CNT is an expensive material and significantly increases the final cost of the product. Moreover, CNT material is hazardous to health. Furthermore, only the galvanic deposition process is mention in the method.

US2003031803 (2003 Feb. 13) describes a method of selective metallization of a substrate part, including the following three steps: a) deposition on said part layer of a precursor composite material consisting of a polymer matrix doped with dielectric particles made of photo-reducing material; b) irradiating the surface to be metallized of the substrate with a laser beam; c) immersing the irradiated part in an autocatalytic bath containing metal ions, where deposition of a metal layer on the irradiated surface takes place. Dimensions of the dielectric particles are equal or less than 0.5 micrometres. The dielectric particles are oxides chosen from ZnO, $TiO_2$, $ZrO_2$, $Al_2O_3$ and $CeO_2$. The composite material layer is approximately 1 micrometre thick, and the composite material is coated using pulse laser deposition.

The disadvantage of the known method is that the step concerning the pre-coating for the very thin layer with dielectric particles limits the method abilities for 3D moulded interconnect devices applications.

US2005/266352 discloses the method of metallic pattern formation in the region of the article made of polyimide where the graft polymer layer deposited on polyamide contains a functional group that interacts with either an electroless plating catalyst or a precursor thereof.

The disadvantages of the known method are that the process is strictly limited by a variety of substrate (base) material to the only polyamide. Moreover, the option of the graft polymer is also strictly limited to the few materials. In addition, the deposition of the graft polymer layer on the base material is also complicated and increase the time of the process (as an additional step) especially for 3D shaped surfaces.

EP 1975276 (2007 March 30) describes a method for preparing a polymer article for subsequent selective metallization. The method comprises submerging the article in a first liquid and irradiation of the submerged article in that liquid by electromagnetic radiation in the areas of the article to be metallised. The metallization comprises an activation step by submerging the article in an activation liquid for deposition of seed particles in the selected area, wherein the seed particles are palladium particles, and the activation liquid comprises a solution of palladium tin salts. The article is rinsed after the activation step followed by metallization comprises a deposition step by after the activation step, submerging the article in a deposition liquid, and metallising the selected area in such way.

The known method contains following disadvantages: laser irradiation process is performed when the article is submerged in a liquid and application for 3D shaped surfaces becomes very sophisticated or almost impossible. The spatial selectivity of the method is low due to the utilisation of palladium nanoparticles. The reason is that Palladium has very strong adsorption, even for laser-unexposed surface areas. Therefore, metal deposition can take place not on the laser-treated surface only but also next to it. Moreover, the process is very slow since laser structuring requires several passes for the same surface areas. In addition, the price of palladium is very high.

Technical Problem to be Solved

The aim of the invention is to produce cost-effectively metallic conductive traces of the circuits on the surface of a polymer without any special additives for the application in 3D moulded interconnect devices. Moreover, the proposed method is able to increase the quality of circuit traces (conductor lines), by increasing their spatial resolution and improving the selectiveness of the metallization process.

DISCLOSURE OF THE INVENTION

In order to solve the above problem according to the proposed invention, a method for formation of electro-conductive traces on polymeric article surface comprising the following steps:

laser treatment of the surface by irradiating the area of the polymeric article, on which the metal is to be deposited, thereby forming a laser-excited area, wherein polymeric article is made from a polymer selected from the thermoplastic or thermosets or their mixture thereof, chemical activation of said laser-excited areas by submerging said polymeric article in the activation solution, where metal ions are attached on said excited areas thereby obtaining activated areas, rinsing of said polymeric article, metal plating of said activated polymer surface areas by submerging said polymeric article into a chemical metallization bath, wherein the laser treatment of said surface areas to be plated is performed in ambient air, and the short pulse duration, irradiation dose and laser beam scanning parameters are chosen experimentally so that a reducing group is formed on the surface of said polymeric article after irradiation, wherein the reducing agent reduces metal ions from said activation solution to a neutral metal atoms or zero degrees of ionisation to enable the electroless catalytic plating process, here with a negative static charge (3) occurs on the surface of said laser-irradiated areas, which avoids any surface degradation of said polymer, wherein the activation solution used for chemical activation is an aqueous solution of metal salt selected one from the list of the salts: silver (Ag) salt, copper (Cu) salt, nickel (Ni) salt, cobalt (Co) salt, zinc (Zn) salt, chrome (Cr) salt, tin (Sn) salt.

Polymer material of the polymeric article is selected from the group of Polypropylene (PP), Acrylonitrile Butadiene Styrene (ABS), Polycarbonate (PC), Polystyrene (PS), Polyethylene (PE), Polybutylene Terephthalate (PBT), Liquid Crystal Polymer (LCP), Cycloolefin Copolymer (COC), Polymethyl-Methacrylate (PMMA), Polytetrafluoroethylene (PTFE), Polyphenylene Ether (PPE), Polyetheretherketones (PEEK), Polyethylene Terephthalate (PET), Polyamide (PA) or their blends thereof.

The polymeric article is produced from Polycarbonate and Acrylonitrile Butadiene Styrene polymers blend (PC-ABS).

A pulse or continuous wave laser is used for said laser-surface treatment, wherein the wavelength of the laser source comprises infrared, visible and ultraviolet range, wherein said irradiation dose is in the range of 0.1-50 J/cm$^2$ and said laser scanning speed is in the range of 0.1-5 m/s, wherein said irradiation dose and scanning speed are chosen experimentally, provided that the irradiated and charged areas become active for adsorption and reduction of metal ions from said aqueous salt solution.

A laser with the pulse duration from 0.1 ps to 900 ps, pulse repetition rate from 10 to 200 kHz and irradiation dose in the range of 1-10 J/cm$^2$ is used for irradiation of the selected areas for metallization, provided that any surface oxidation of said polymer article is avoided during laser treatment in ambient air.

The chemical activation solution consists of silver nitrate $AgNO_3$ or silver diamine complex $Ag(NH_3)_2$ aqueous solution at the concentration of 0.0000001-1 M.

After the activation and rinsing procedures, said polymeric article is submerged into a chemical metallization bath containing: metal ions, ligand for complexion of metal ions, reducing agent for metal ions reduction, and buffer for keeping constant pH-value of the solution, provided that said areas treated by laser and chemically activated will be deposited by a metal from the said bath.

Chemical activation is performed at 20° C. temperature for 15 min.

Said chemical metallization bath is the copper plating bath which consists of: copper sulphate $CuSO_4$ in the concentrations of 0.05-0.25 M (copper (II) source), formaldehyde in the concentration of 0.0015-6 M (reducing agent), ligand chosen from the group of polyols, hydroxy-polycarboxylic acids, polyamine-polycarboxylic acids, polyamine-polyhydroxy compounds comprising: glycerol, citric acid, isomers of tartaric acid, EDTA, DTPA, CDTA, Quadrol, in the concentrations of 0.15-0.75 M. In the electroless copper plating bath, sodium carbonate $Na_2CO_3$ in the concentrations of 0.05-0.6 M and sodium hydroxide NaOH in the concentrations of 0.1-2 M are used as a buffering environment at pH-values of 12-13.5. The temperature of the electroless copper plating bath is kept in the ranges 5-90° C. during the plating process.

Said copper plating bath contains: 0.12 M Copper (II) sulphate ($CuSO_4$), 0.25 M Quadrol ([$CH_3CH(OH)CH_2$]$_2NCH_2CH_2N[CH_2CH(OH)CH_3]_2$), 1.25 M Sodium hydroxide (NaOH), 0.3 M Sodium carbonate ($Na_2CO_3$) and 0.34 M formalin ($CH_2(OH)_2$) aqueous solution, at pH=12.7 and the 30° C. plating temperature.

Said chemical plating bath is a silver plating bath containing: 0.001-0.1 M $AgNO_3$-silver(I) ions source; 0.001-0.8 M $CoSO_4$— reducing agent; 0.1-1 M $(NH_4)_2SO_4$ and 0.1-5 M $NH_4OH$ as ligands. The electroless silver plating takes place when the pH-value of the plating bath ranges 12-13.5, and the plating temperature being 30° C.

Advantages of the Invention

The present invention proposes a method for formation of electro-conductive traces on the polymeric article surface. Standard industrial polymers without any special additives for activation are used in the present invention. The areas which should be deposited by a metal are irradiated with a laser in ambient air. The set of laser parameters is chosen in such a way that the irradiated surface areas get a negative static charge. Therefore, the surface becomes active for adsorption and reduction of metal ions from a metal salt solution. Use of ultra-short laser pulses allows avoiding surface degradation. The laser treated areas are later activated with a salt solution and, subsequent, the metallization in the electroless plating bath is used. The present invention enables the significant improvement of metallic circuitry plating on polymer surface and the spatial selectivity of the plating. The method allows achieving a plating accuracy down to 3 μm. The reason for the high resolution of the plating is that metal ions from the activation solution are not adsorbed or almost not adsorbed to the surface unexposed by the laser, unlike palladium nanoparticles utilised in another known methods.

The present invention enables to reach a very high, up to 5 m/s speed of laser scanning, which depends on the material. The control of the metallic line width is possible by varying a diameter of the Gaussian laser beam on the surface. The laser excitation process accepts a broad range of beam diameter from 10 to 250 μm. Such a control of the beam diameter enables to increase a processing rate of a circuit traces with a larger width.

DESCRIPTION OF CARRYING OUT THE INVENTION

Figure 1:
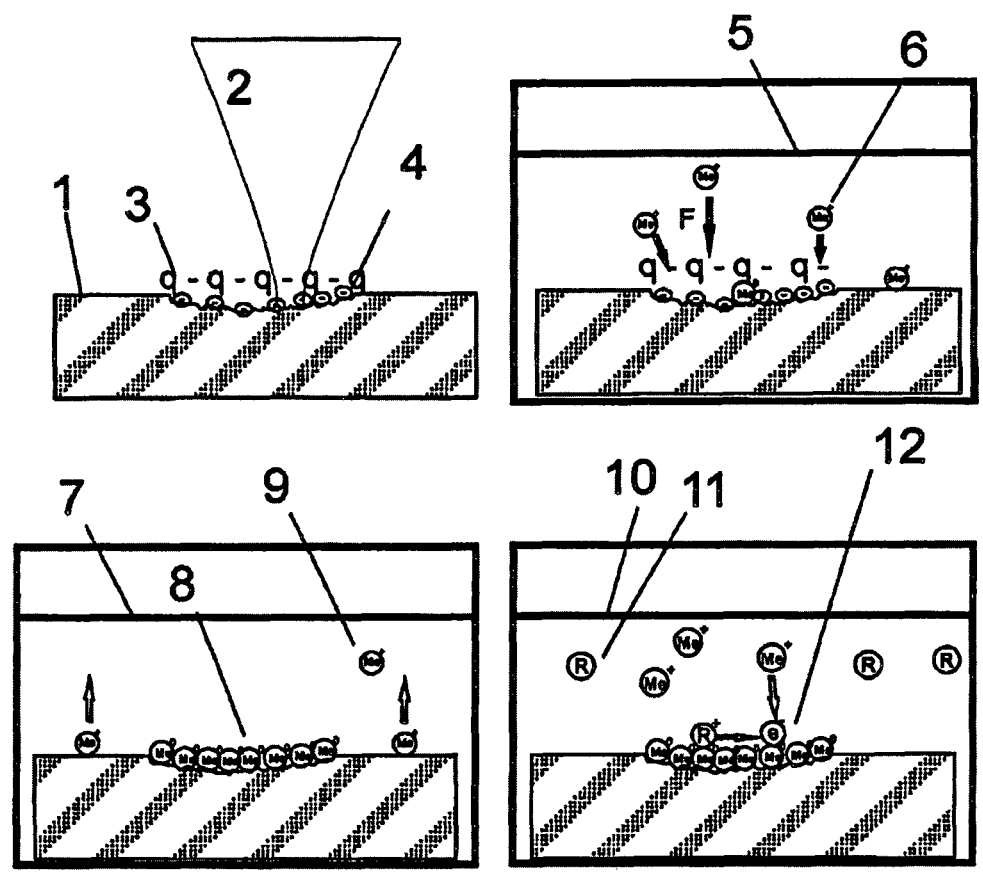
FIG. 1. illustrates embodiments of process steps of proposed method:
a) surface excitation by a laser;
b) chemical activation of the laser-treated areas by the aqueous solution of a metal salt;
c) rinsing the article in distilled water;
d) electroless catalytic deposition of metal.

References to the numbers shown in drawings: the polymeric article 1; the laser beam 2; surface static charge 3; the reducing agent 4; the aqueous solution of a metal salt 5; metal ions in the activation solution 6; distilled water 7; metal ions 8 on polymer 1 surface; desorbed ions from polymer surface 9; electroless autocatalytic plating bath 10; reducing agent 11 in plating bath 10; electrons 12.

Technology process of the present invention contains following steps:

The first step is laser irradiation 2 of polymeric surface areas which are intended to be deposited by a metal, therefore forming the excited areas for chemical activation. The polymeric article 1 is produced from standard polymeric material selected from the group of: Polypropylene (PP), Acrylonitrile Butadiene Styrene (ABS), Polycarbonate (PC), Polystyrene (PS), Polyethylene (PE), Polybutylene Terephthalate (PBT), Liquid Crystal Polymer (LCP), Cycloolefin Copolymer (COC), Polymethyl-Methacrylate (PMMA), Polytetrafluoroethylene (PTFE), Polyphenylene Ether (PPE), Polyetheretherketones (PEEK), Polyethylene Terephthalate (PET), Polyamide (PA) or their blends thereof.

Areas provided for metallization are irradiated with a pulse or continuous wave laser. The laser wavelength comprises infrared, visible and ultraviolet range. Irradiation dose is from 0.1 to 50 J/cm$^2$. All sets of laser process parameters are chosen experimentally in such a way that irradiated surface areas gets a negative static charge, herewith avoiding surface degradation. When a pulsed laser is used for irradiation the pulse duration can be selected from the range from 0.1 ps to 900 ps, pulse repetition rate from 10 to 200 kHz, the wavelength from 355 to 1064 nm and irradiation dose from 3 to 5 J/cm$^2$. The laser beam is scanned over the selected polymer surface areas using a galvanometric scanner or translating the beam or the article relative each other. The scanning speed ranges from 0.1 to 5 m/s depending on the laser process parameters and material properties. The width of the metallic traces written by a single scan can be controlled by the diameter of the Gaussian laser beam, which can be easily varied from 10 to 250 μm.

Laser-treated surface areas get a static charge, therefore, becomes active for adsorption and reduction of ions from the activation solution. Laser untreated areas remain inactive or almost inactive for adsorption of ions from the activation solution. Apparently adsorbed ions on laser-untreated areas (which are a minority) can be washed out during the rinsing step. However, ions adsorbed on laser treated areas remain after the rinsing. The temperature of the polymer surface is locally increased after absorption of laser irradiation. When the temperature exceeds a certain value (depending on a polymer), it results in bond-breaking of a polymeric molecule by the thermochemical decomposition. Hereby, many radicals having negative charge 3 appear. For the mentioned reason, the metal ions 6 are attracted by the Coulomb forces toward the opposite potential on the laser-treated polymer surface. Therefore, ions 6 are attached to the laser-irradiated areas. At some laser treatment regimes, the polymer surface can also change its structure, and this is influenced by thermomechanical effects after absorption of the irradiation. Transformation of the polymer surface to a porous, sponge-like structure, can take place. Said structure also assists the localisation of metal ions on the laser-treated areas since the rinsing of metal ions from a porous structure is more difficult.

Several known methods of laser-induced selective plating of polymers are based on surface modification into the porous structure. In the present invention, the formation of the porous structure (for a particular set of the laser processing parameters) is a secondary process, but not the core one for the selective metal plating. In a proposed method, local activation of the polymer surface is driven by the laser-induced surface static charge. Polymer oxidation can be avoided by choosing short laser pulse duration in the range of 0.1-50 ps due to a very short interaction time. Therefore, there is no surface degradation (burning process). Processing of the PC/ABS surface with ultrashort laser pulses results not only in the gain of static charge but also in the decomposition of the molecular bond due to the nonlinear multiphoton interaction of ultra-short laser pulses with the polymer. The mentioned decomposition leads to a formation of a reducing agent on the laser treated surface. A formed said agent is capable of reducing the metal from a positively charged ion to a neutral atom. Reduction of the adsorbed metal ion is a key chemical process since the electroless catalytic plating takes place only on a neutral atom of metal.

Second step: chemical activation of the laser-treated areas. The chemical activation is performed by submerging a polymeric article treated by a laser to a solution of metal salt consisting of silver nitrate $AgNO_3$ or silver ammonia complex $Ag(NH_3)_2$, which the concentration is in the range of 0.0000001-1 M temperature being 15-60° C. Metal ions are adsorbed on said laser-treated areas. In the case of silver nitrate or silver ammonia complex, the metal ions are silver ions. Reduction of an adsorbed ion to a neutral atom takes place (ions forms a metallic phase on a polymer surface). In the case of some polymers such as PC/ABS, the reduction can occur by assisting of chemical compounds (as reducing groups) which are formed after photochemical decomposition of the polymer at the irradiated surface. Silver ion can also be reduced in at the fourth step since electroless plating bath contains a reducing agent itself.

Third step. Rinsing of the polymeric article in distilled water. The rinsing is performed in such way that all silver particles/ions remain on laser-treated areas only. The ions adsorbed on the unexposed areas have to be washed away.

Fourth step. Following after rinsing procedure, the polymer article is submerged into a chosen metallization bath. The electroless catalytic plating process is used. Laser-treated and chemically-activated areas are metallised during this step. The said bath contains a chosen metal ions (for example, copper), ligand, reducing agent and a buffer. Various metals: copper, nickel, palladium, etc., can be used for deposition. The copper plating bath contains: copper sulphate $CuSO_4$ in the concentrations of 0.005-0.25 M (copper source), formaldehyde in the concentration of 0.0015-6 M (reducing agent), ligand chosen from the group of polyols, hydroxy-polycarboxylic acids, polyamine-polycarboxylic acids, polyamine-polyhydroxy compounds comprising: glycerol, citric acid, isomers of tartaric acid, EDTA, DTPA, CDTA, Quadrol, et cetera, in the concentrations of 0.15-0.75 M. The electroless copper plating bath contains in addition sodium carbonate $Na_2CO_3$ in the concentrations of 0.05-0.6 M and sodium hydroxide NaOH in the concentrations of 0.1-2 M—as a buffering environment at pH-values of 12-13. The temperature of electroless copper plating bath during process ranges 5-90° C.

As an example, the chemical metallization solution may consist of 0.12 M copper sulphate ($CuSO_4$), 0.25 M Quadrol ($[CH_3CH(OH)CH_2]_2NCH_2CH_2N[CH_2CH(OH)CH_3]_2$), 1.25 M sodium hydroxide (NaOH), 0.3 M sodium carbonate ($Na_2CO_3$) and 0.34 M formalin. The pH-value is kept 12.7. The temperature of plating process is 30° C.

Firstly, the catalytic anodic oxidation reaction of the formaldehyde reducing agent takes place in the electroless plating process. Therefore, free electrons appear on the surface of the catalyst as a final product of its oxidation reaction. Following, the cathodic redox reaction of copper ions is being proceeded by free electrons on the catalyst surface (wherein initially, a catalyst are silver atoms, later deposited copper). The yield of the redox process strongly depends on the ligand properties, (both from bonding strength with a metal ion and adhesion on the surface) since copper ion is not free in the solution and consists of a complex with ligands. The Quadrol-copper complex has a strong adhesion to the catalyst surface, thus, increasing concentration of copper atoms. Finally, a better plating quality is achieved as a result of the higher copper yield on the surface.

Figure 2:
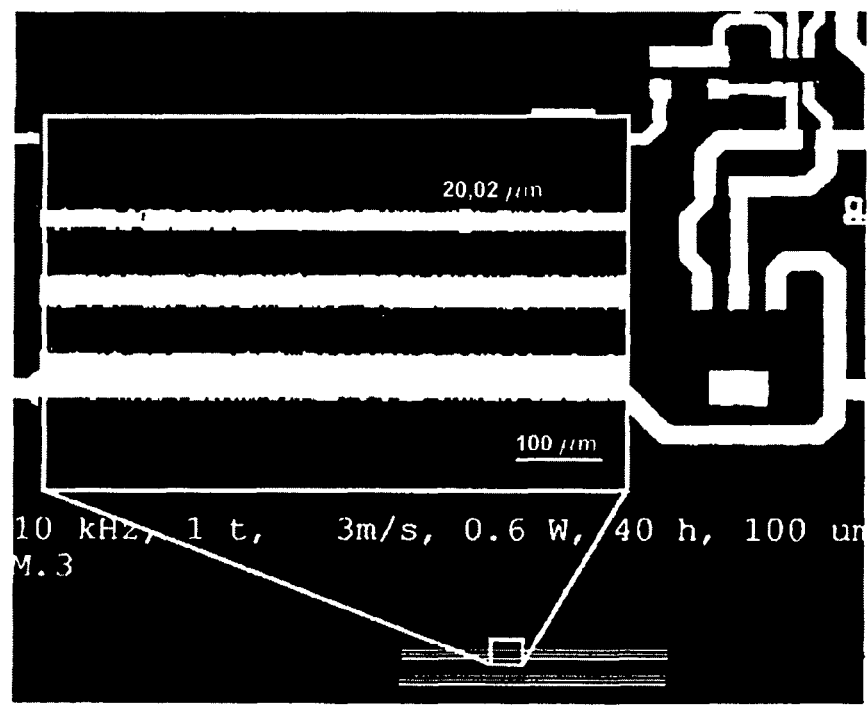
FIG. 2. shows example of the selective copper-plated surface of the PC/ABS polymer.

In FIG. 2, PC/ABS polymer surface selective metalled by copper is presented: a fragment of an electronic circuit, and the microscopic image of the copper-plated lines. The high spatial selectiveness of a few tens of micrometres can be clearly visible in the figure.

Example 1

Materials: a polymeric article was fabricated using the PC/ABS bayblend T65 masterbatch. The masterbatch was heated and mixed in a chamber at the 270-280° C. temperature for 4-5 min. Following, the mixture was injected into the mould using an injection moulding machine. The press heating to 275-285° C. was utilised, and the mixture was loaded with about 20 bars.

Laser treatment: the laser source was a picosecond Nd:$YVO_4$ laser (Atlantic, EKSPLA), radiating at the wavelength of 1064 nm. The pulse repetition rate ranged 50-100 kHz. The average laser power was 1 W. A galvanometric scanner (SCANLAB) was used for the beam translation. The 80 mm F-Theta telecentric objective was applied for laser beam focusing. The diameter of the Gaussian beam on the surface was 83 μm. The pattern of the laser-scanned areas contained the band-shaped areas. The width of the bands ranged from a single scanned line up to several lines with the 50% overlap between scans (half of neighbour line overlapped each over). The scanning speed was 0.5 m/s at the 50 kHz pulse repetition rate; and 1 m/s at the 100 kHz pulse repetition rate.

Chemical activation: Article was submerged into silver nitrate ($AgNO_3$) aqueous solution at a concentration of $5 \times 10^{-2}$ M after the laser treatment.

Rinsing: the polymeric article was rinsed in distilled water.

Metal plating: The activated article was submerged into the copper electroless plating bath immediately after the rinsing. The bath consisted of: 0.12 M $CuSO_4$ (copper sulphate), 0.35 M Sodium potassium tartrate, 1.25 M NaOH (sodium hydroxide), 0.3 M $Na_2CO_3$ (sodium carbonate), 0.34 M $CH_2O$ (formaldehyde), pH=12.7. The plating time was 60 min, at the 30° C. temperature.

Results: analysis of plated metal bands was carried out after the metal plating procedure. Results indicated that the narrowest width of the plated line was equal to 25 μm. The measurement of sheet resistance was also performed using the Keithley 2002 SourceMeter. The sheet resistance was $<R_s> = 3 \cdot 10^{-3} \Omega/\square$. The Scotch tape test was applied for adhesion strength check. The result of the test showed that all the metal lines remained on the polymer surface after the peel off procedure.

Example 2

Materials: a polymeric article was fabricated using granules of the PP Hostacom CR 1171 G1. The masterbatch was heated and mixed in a chamber at the 170-180° C. temperature for 4-5 min. Following the mixture has been injected into the mould using an injection moulding machine. The Mixture was heated to 175-195° C. and loaded by about 20 bars.

Laser treatment: the Nd:YAG (Baltic HP, EKSPLA) laser with the second harmonics was used for the surface treatment at the wavelength of 532 nm. The pulse repetition rate was 50 kHz. The average laser power was 1 W. A galvanometric scanner (SCANLAB) was used for the laser beam translation. The 80 mm F-Theta telecentric objective was applied for focusing. The diameter of Gaussian beam on the polymer surface was 95 μm. A pattern of the laser scanned areas contained the band-shaped areas. The width of the bands ranged from a single scanned line up to several lines with the 50% of overlapping (half of neighbour line overlapped each over). The scanning speed was 0.5 m/s at 50 kHz pulse repetition rate.

Chemical activation: after the laser processing, the polymer article was submerged into silver diamine $Ag(NH_3)_2$ aqueous solution at the concentration of $1 \times 10^{-4}$ M.

Rinsing: The article was rinsed in distilled water.

Metal plating: Following, the activated and rinsed article was submerged into the copper electroless plating bath, which consisted of 0.12 M $CuSO_4$ (copper sulphate), 0.35 M Sodium potassium tartrate, 1.25 M NaOH (sodium hydroxide), 0.3 M $Na_2CO_3$ (sodium carbonate), 0.34 M $CH_2O$ (formaldehyde). The pH-value of the bath was 12.7. The plating procedure lasted 60 min. at the 30° C. temperature.

Results: analysis of the plated metal bands was carried out after the metal plating procedure. The results indicated that the narrowest width of the metal-plated line was 20.1 μm. The measurement of sheet resistance was also performed using the Keithley 2002 SourceMeter. The sheet resistance was $<R_S>=8.10^{-3} \Omega/\square$. The Scotch tape test was applied for the adhesion strength check, which showed that all the metal lines remained on the polymer surface after the peel off procedure.

The invention claimed is:

1. A method for formation of electro-conductive traces on a polymeric article having a surface, the method comprising:
   irradiating, by a pulse laser, in ambient air, areas of the surface of the polymeric article to receive a metal deposit thereby forming an area of excitation for chemical activation, wherein the polymeric article comprises a thermoplastic polymer, a thermoset polymer, or a combination thermoplastic and thermoset polymer, and wherein parameters of the laser are selected from a group consisting of: a short pulse duration parameter of 0.1 ps to 900 ps, an irradiation dose parameter, and a laser beam scanning speed parameter to facilitate formation of a formed reducing agent on the areas of the polymeric article surface irradiated by the pulse laser in the ambient air and avoid oxidation of the surface of the polymer article;
   chemically activating, using an aqueous metal salt bath comprising an aqueous metal salt, the areas of the polymeric article surface irradiated by the pulse laser by submerging the polymeric article in the aqueous metal salt bath, wherein metal ions of the aqueous metal salt are adsorbed, reduced by the formed reducing agent, and chemically activate the areas of the polymeric article surface irradiated by the pulse laser to generate catalyst areas;
   rinsing, the polymeric article by water, wherein debris and the aqueous metal salt are removed from the surface of the polymeric article; and
   plating, by an electroless catalytic plating process, the chemically activated areas of the surface of the polymeric article by submerging the polymeric article into a chemical metallization bath;
   wherein the formed reducing agent on the surface of the polymeric article reduces metal ions after their adsorption on the surface of the polymeric article from the aqueous metal salt bath to neutralize metal atoms enabling the electroless catalytic plating process;
   wherein a resultant surface negative static charge occurring on the areas of the surface of the polymeric article irradiated by the pulse laser increases an amount of localisation of the adsorbed metal ions from the aqueous metal salt bath at the surface of the polymeric article irradiated by the pulse laser and the short pulse duration of the pulse laser with the surface of the polymeric article avoids degradation of the surface of the polymeric article; and
   wherein the aqueous metal salt bath used to chemically activate the areas of the polymeric article is an aqueous solution of metal salt selected from a group consisting of: silver (Ag) salt, copper (Cu) salt, nickel (Ni) salt, cobalt (Co) salt, zinc (Zn) salt, chrome (Cr) salt, and tin (Sn) salt.

2. The method according to claim 1, wherein a polymer of the polymeric article is selected from the group consisting of: Polypropylene (PP), Acrylonitrile Butadiene Styrene (ABS), Polycarbonate (PC), Polystyrene (PS), Polyethylene (PE), Polybutylene Terephthalate (PBT), Liquid Crystal Polymer (LCP), Cycloolefin Copolymer (COC), Polymethyl-Methacrylate (PMMA), Polytetrafluoroethylene (PTFE), Polyphenylene Ether (PPE), Polyetheretherketones (PEEK), Polyethylene Terephthalate (PET), and Polyamide (PA).

3. The method according to claim 1, wherein the polymeric article is produced from a blend of a Polycarbonate (PC) polymer and an Acrylonitrile Butadiene Styrene (ABS) polymer.

4. The method according to claim 1, wherein:
   the pulse laser has a wavelength in a range of infrared, visible and ultraviolet;
   wherein a dose of irradiation is in a-range of 0.1-50 $J/cm^2$ and a laser scanning speed is in a range of 0.1-5 m/s; and
   such that the dose of irradiation and the laser beam scanning speed are selected to activate the areas of the surface of the polymeric article irradiated by the pulse laser for adsorption and reduction of metal ions from the aqueous metal salt bath.

5. The method according to claim 4, wherein the pulse laser comprises a pulse duration from 0.1 ps to 50 ps, a pulse repetition rate from 10 to 200 kHz and a dose of irradiation in the range of 1-10 $J/cm^2$ and is used for irradiation of the areas of the surface of the polymeric article for metallization.

6. The method according to claim 1, wherein the aqueous metal salt comprises a silver nitrate ($AgNO_3$) or a silver diamine complex ($Ag(NH_3)_2$) aqueous solution at a concentration of 0.0000001-1 M.

7. The method according to claim 6, wherein the chemical activation is performed at a temperature of 20° C. for 15 minutes.

8. The method according to claim 1, wherein the polymeric article is submerged into the chemical metallization bath of a solution containing: metal ions, a ligand for complexion of metal ions, a reducing agent for the metal ions, and a buffer to maintain a constant pH-value of the chemical metallization bath, wherein the areas of the surface of the polymeric article irradiated by the laser and chemically activated by the aqueous metal salt bath receive deposition of a metal from the chemical metallization bath.

9. The method according to claim 1, wherein the chemical metallization bath is an electroless copper plating bath comprising: copper sulfate ($CuSO_4$) in a concentration of 0.05-0.25 M (copper (II) source), formaldehyde in a concentration of 0.0015-6 M (a reducing agent), ligand chosen from the group of polyols, hydroxy-polycarboxylic acids, polyamine-polycarboxylic acids, polyamine-polyhydroxy compounds comprising: glycerol, citric acid, isomers of tartaric acid, EDTA, DTPA, CDTA, (N,N,N',N'-Tetrakis(2-hydroxypropyl)ethylenediamine), in a concentrations of 0.15-0.75 M, wherein in the electroless copper plating bath, sodium carbonate ($Na_2CO_3$) is present in a concentration of 0.05-0.6 M and sodium hydroxide (NaOH) in a concentration of 0.1-2 M are used as a buffering environment at pH-values of 12-13.5; and wherein a temperature of the electroless copper plating bath is maintained in a range of 5-90° C. during the plating process.

10. The method according to claim 9, wherein the copper plating bath is an aqueous solution which comprises: 0.12 M Copper (II) sulfate ($CuSO_4$), 0.25 M (N,N,N',N'-Tetrakis(2-hydroxypropyl)ethylenediamine), 1.25 M Sodium hydroxide (NaOH), 0.3 M Sodium carbonate ($Na_2CO_3$) and 0.34 M formaldehyde ($CH_2(OH)_2$), at pH=12.7 and a temperature of 30° C.

11. The method according to claim 1, wherein the chemical metallization bath is an electroless silver plating bath comprising: 0.001-0.1 M $AgNO_3$— silver(1) ions source; 0.001-0.8 M $CoSO_4$— reducing agent; 0.1-1 M $(NH_4)_2SO_4$ and 0.1-5 M $NH_4OH$ as ligands, wherein electroless silver plating occurs when the plating bath is at a pH-value within a range of 12-13.5, and a temperature of 30° C.

* * * * *